(12) United States Patent
Braasch

(10) Patent No.: US 6,437,438 B1
(45) Date of Patent: Aug. 20, 2002

(54) EDDY CURRENT LIMITING THERMAL PLATE

(75) Inventor: Robert A. Braasch, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/608,588

(22) Filed: Jun. 30, 2000

(51) Int. Cl.$^7$ ............................................... H01L 23/34
(52) U.S. Cl. ...................... 257/712; 257/706; 257/701; 257/709; 438/122
(58) Field of Search ......................... 257/701, 712–722, 257/704, 706, 707; 438/122, 125

(56) References Cited

U.S. PATENT DOCUMENTS 5,491,301 A * 2/1996 Akiba et al. ................. 174/250
6,085,833 A * 7/2000 Kimura et al. .............. 165/185

* cited by examiner

Primary Examiner—Douglas Witle
Assistant Examiner—Dilinh Nguyen
(74) Attorney, Agent, or Firm—Blakely, Sokoloff, Taylor & Zafman LLP

(57) ABSTRACT

The present invention is a method and apparatus to limit eddy current in a thermal plate. A plate is coupled to a die of an integrated circuit for thermal dissipation. The plate has first and second pluralities of grooves comprising non-periodic lines in first and second directions, respectively. The first and second pluralities of grooves form a grid pattern.

25 Claims, 3 Drawing Sheets

EDDY CURRENT LIMITING THERMAL PLATE

BACKGROUND

1. Field of the Invention

This invention relates to integrated circuits (IC). In particular, the invention relates to IC packaging.

2. Description of Related Art

Thermal management is an important problem in semiconductor manufacturing. As high performance integrated circuits (IC) such as microprocessors push for higher and higher operating frequencies, the amount of heat they generate is increased. If the heat is not quickly and adequately dissipated, the increased temperatures may affect the performance and accelerate the aging process of the IC's.

One approach to deal with heat generation is to use heat sinks to transfer or dissipate heat. A typical heat sink includes a thermal plate to be positioned in contact with the die or the core of the IC, either directly or via some thermal interface layer such as thermal grease. Although the traditional heat sink technique seems to provide some relief for thermal management, it incurs additional problems. One of these problems is the increase in electromagnetic interference (EMI) or radio frequency interference (RFI) caused by increase in eddy currents. Eddy currents are generated due to the interaction between the high switching rate of currents through the core and the thermal plate. The thermal plate acts like a radiation antenna that can generate significant radiation.

Therefore, there is a need to have a technique that can limit the eddy currents in thermal management.

SUMMARY

The present invention is a method and apparatus to limit eddy current in a thermal plate. A plate is coupled to a die of an integrated circuit for thermal dissipation. The plate has first and second pluralities of grooves comprising non-periodic lines in first and second directions, respectively. The first and second pluralities of grooves form a grid pattern.

BRIEF DESCRIPTION OF THE DRAWINGS

The features and advantages of the present invention will become apparent from the following detailed description of the present invention in which.

DESCRIPTION

The present invention is a method and apparatus to limit eddy current in a thermal plate. A plate is coupled to a die of an integrated circuit for thermal dissipation. The plate has first and second pluralities of grooves comprising non-periodic lines in first and second directions, respectively. The first and second pluralities of grooves form a grid pattern.

Figure 1:
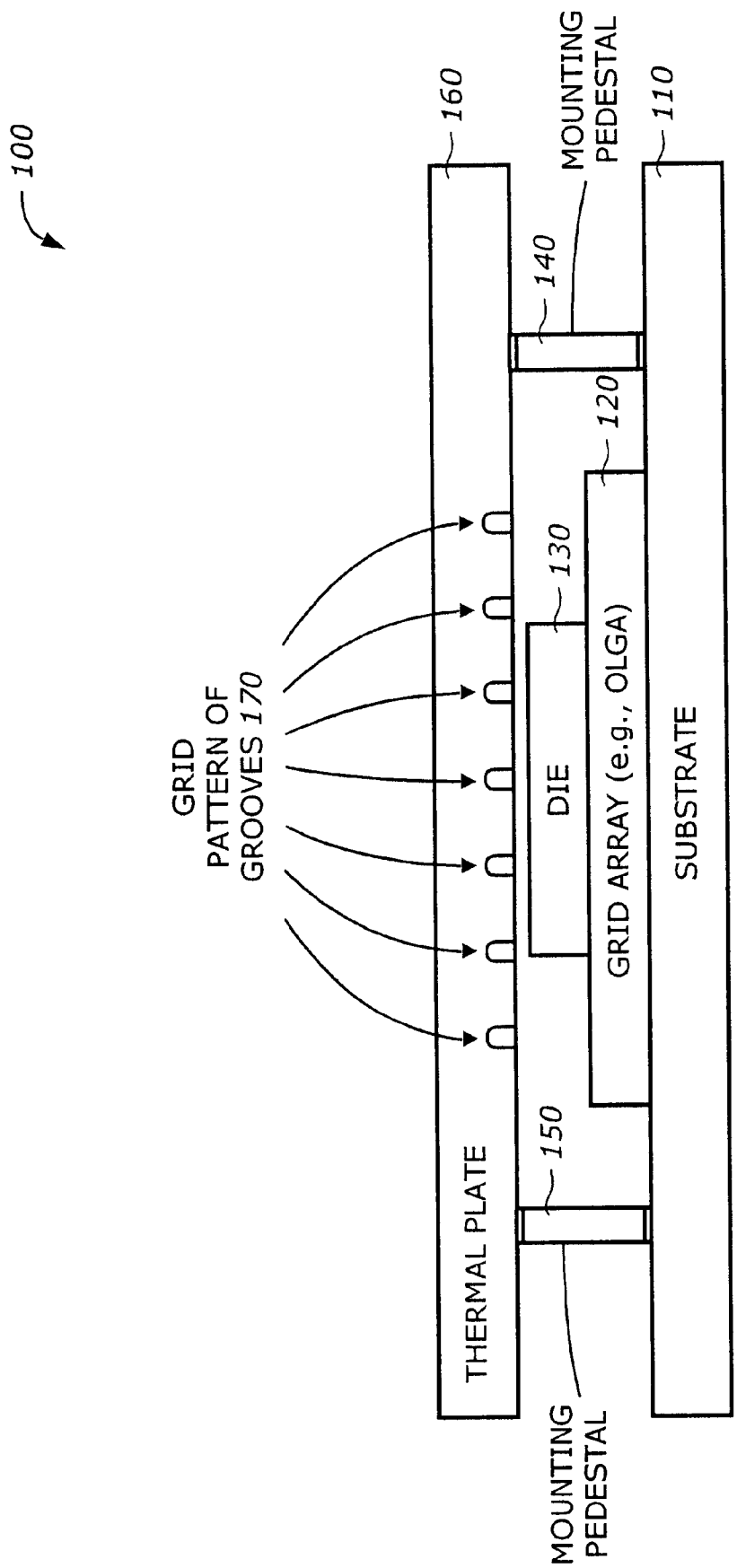
FIG. 1 is a diagram illustrating an integrated circuit package assembly according to one embodiment of the invention.

FIG. 1 is a diagram illustrating an integrated circuit (IC) package assembly 100 according to one embodiment of the invention. The assembly 100 includes a substrate 110, a packaging array 120, a die 130, mounting pedestals 140 and 150, and a thermal plate 160.

The substrate 110 is a layer of interconnection material used to interconnect various elements in the assembly. The material may be copper plated with nickel/palladium/gold finish or any other suitable material. The packaging array 120 is used to provide a packaging means for interfacing to elements external to the assembly 100. In one embodiment, the packaging array 120 is an organic land grid array (OLGA). This invention can be used with any conductive cover in proximity to the die, regardless if used for a heat sink. The die 130 is a core of an integrated circuit containing circuitry and signal traces that carry currents when power is applied. The integrated circuit may be any of high performance devices that operate with high frequencies. Examples of the IC include microprocessors, bridges, high density memories, and complex input/output devices (e.g., network interface, graphics, imaging, high speed bus controller). During active operation, the die 130 may have high currents with direct current (DC) pulses. These DC pulses may form high frequency signals running through the traces on the die 130.

The mounting pedestals 140 and 150 are mounted on the substrate to provide support for the thermal plate 160. The mounting pedestals 140 and 150 may be part of a thermal cover mechanism to support the thermal plate 160 at appropriate distance. The thermal plate 160 is part of a heat sink assembly to provide cooling for the various elements (e.g., the die 130) of the assembly 100. The thermal plate 160 performs this function by dissipate heat over its entire surface. In one embodiment, the thermal plate 160 is made of aluminum. The thermal plate 160 has a grid of grooves 170 edged on or cut into the bottom surface. The thermal plate 160 with the grid of grooves 170 not only provides the necessary heat dissipation but also limits the amount of eddy currents generated by the die 130, resulting in lower radiation emission.

The currents generated by the integrated circuit in the die 130 may operate at any frequency. When signal switching occurs as caused by transistors turning on and off, the thermal plate 160 together with the die 130 form an inductor which generate eddy currents. The thermal plate 160 essentially acts like a radiating antenna which emits radiation. The radiation forms an electromagnetic interference (EMI) or radio frequency interference (RFI) that need to be shielded or reduced to meet the radiation level as required by the Federal Communication Committee (FCC). When currents flow through the die 130, electrons are moving at certain speed depending on the switching frequency. Radiation is emitted according to the resonant frequencies of the electrons. The grid of grooves 170 on the thermal plate 160 is designed not to coincide with the resonant frequencies, essentially reducing the eddy currents resulting in reduced radiation emission.

Figure 2:
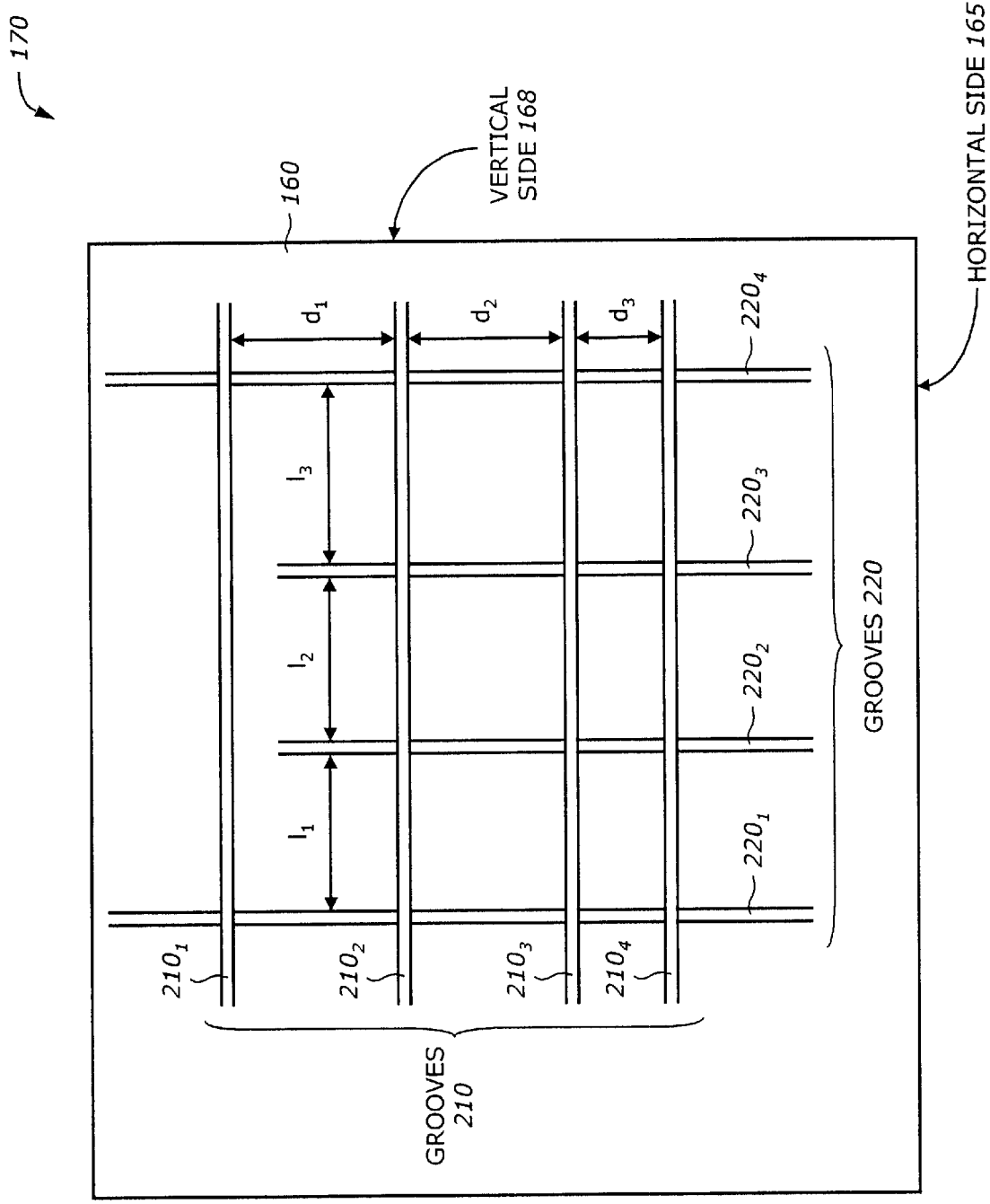
FIG. 2 is a diagram illustrating a grid pattern on the thermal plate according to one embodiment of the invention.

FIG. 2 is a diagram illustrating a grid pattern 170 according to one embodiment of the invention. The grid pattern 170 includes a first group of lines 210 and a second group of lines 220.

The groups 210 and 220 include a number of grooves edged or cut into on the same side of the plate 160 with a predetermined depth or depression level. In the illustrative embodiment shown in FIG. 2, the thermal plate 160 is rectangular having a horizontal side 165 and a vertical side 168. In one embodiment, the dimensions of the thermal plate 160 are approximately 5.3×2.3×0.14 inches, and the depth of the grooves range from 1 millimeter (mm) to 2 mm. The first group 210 has 4 lines $210_1$, $210_2$, $210_3$, and $210_4$, and the second group 220 has four lines $220_1$, $220_2$, $220_3$, and $220_4$. The lines are approximately parallel to one another in each group 210 and 220. The lines in the first group 210 are approximately parallel to the horizontal side 165 of the thermal plate 160. The lines in the second group 220 are approximately parallel to the vertical side 168 of the thermal plate 160. The direction of the lines in group 1 is not necessarily to be orthogonal to the direction of the lines in group 2. Depth and spacing on the grooves are dependent on the frequency and physical layout of the integrated circuit.

The lines are non-periodic in that the distances between two adjacent lines are not the same. Let $l_1$, $l_2$, and $l_3$ be the distances between the line pairs ($210_1$, and $210_2$), ($210_2$ and $210_3$), ($210_3$ and $210_4$), respectively. Let $d_1$, $d_2$, and $d_3$ be the distances between the line pairs ($220_1$ and $220_2$), ($220_2$ and $220_3$), ($220_3$ and $220_4$), respectively. Typically, $l_1 \neq nl_2$, $l_2 \neq nl_3$, and $d_1 \neq nd_2$, $d_2 \neq nd_3$ where n=1, 2, 3 . . . By having different distances of lines in a group, the thermal plate 160 provides several frequencies which mostly are not coincident with the resonant frequencies generated by the circuitry in the die 130 at a particular instance. The distances are determined by the frequency of the electronic system and the properties of the metal. In essence, since there are several frequencies provided by the thermal plate 160, even if there is a chance that one of them coincides with the resonant frequency of the signals generated by the integrated circuit, other frequencies tend to attenuate the radiation emission.

Figure 3:
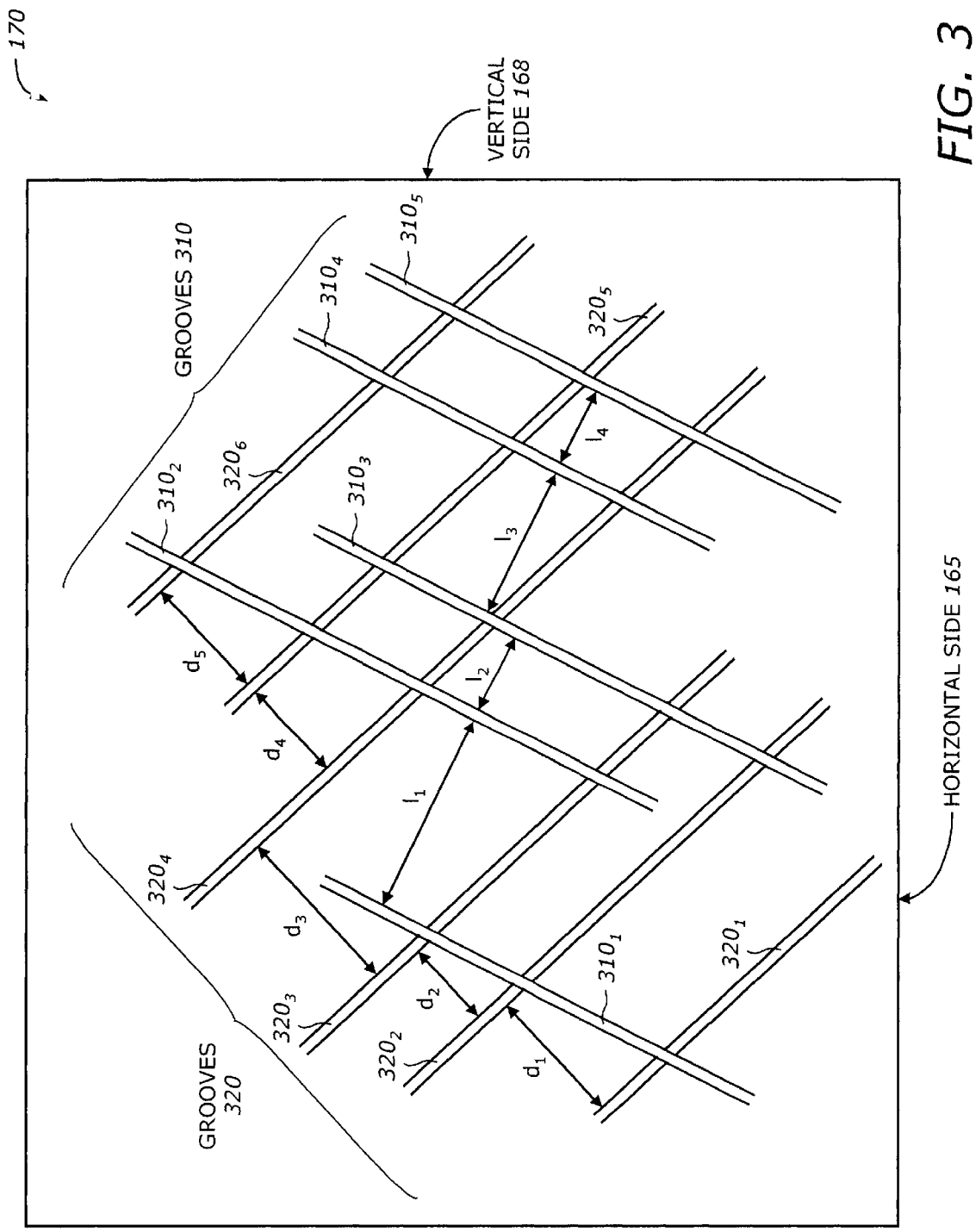
FIG. 3 is a diagram illustrating another grid pattern on the thermal plate according to one embodiment of the invention.

FIG. 3 is a diagram illustrating another grid pattern 170 on the thermal plate 160 according to one embodiment of the invention. The grid pattern 170 includes a first group of lines 310 and a second group of lines 320.

The groups 310 and 320 also include a number of grooves edged or cut into on the same side of the plate 160 at some predetermined depth. The grid pattern 170 in FIG. 2 differs the grid pattern 170 in FIG. 2 in that the first group of lines 310 is edged or cut into at a slanted direction with respect to the horizontal side 165 of the plate 160. Similarly as in the grid pattern 200, the groups 310 and 320 consist of non-periodic lines. In the illustrative embodiment shown in FIG. 3, the first group 310 includes five lines $310_1$, $310_2$, $310_3$, $310_4$, and $310_5$ and the second group 320 includes six lines $320_1$, $320_2$, $320_3$, $320_4$, $320_5$, and $320_6$. The lines $310_1$, $310_2$, $310_3$, $310_4$, and $310_5$ are approximately parallel to one another in a first direction and the lines $320_1$, $320_2$, $320_3$, $320_4$, $320_5$, and $320_6$ are also approximately parallel to one another in a second direction. The first direction is slanted with respect to the horizontal side 165 of the thermal plate 160. The second direction forms an angle with the first direction. The first and second directions are not necessarily orthogonal to each other.

Let $l_1$, $l_2$, $l_3$, and $l_4$ be the distances between the line pairs ($310_1$, and $310_2$), ($310_2$ and $310_3$), ($310_3$ and $310_4$), and ($310_4$ and $310_5$), respectively. Let $d_1$, $d_2$, $d_3$, $d_4$, and $d_5$ be the distances between the line pairs ($320_1$, and $320_2$), ($320_2$ and $320_3$), ($320_3$ and $320_4$), ($320_4$ and $320_5$), and ($320_5$ and $320_6$), respectively. The lines $310_1$, $310_2$, $310_3$, $310_4$, and $310_5$ and $320_1$, $320_2$, $320_3$, $320_4$, $320_5$, and $320_6$ are non-periodic in that the distances between adjacent lines in the same group are not the same. In other words, $l_1 \neq kl_2$, $l_2 \neq kl_3$, and $l_3 \neq kl_4$ where k=1, 2, 3, . . . and $d_1 \neq nd_2$, $d_2 \neq nd_3$, $d_3 \neq nd_4$, and $d_5$ where n=1, 2, 3, . . . The grid pattern 300 also helps reducing EMI and/or RFI generated by the die 130 by limiting the eddy currents.

Experimental results are shown in Table 1. The table shows the dB level without grooves and with grooves. The depth of the grooves is approximately 1 mm for samples 1 and 2 and approximately 2 mm for samples 3 and 4.

TABLE 1

| Frequency (MHz) | No Groove | Sample 1 | Sample 2 | Sample 3 | Sample 4 |
| --- | --- | --- | --- | --- | --- |
| 431 | 34.01 | 32.11 | 33.5 | 30.51 | 32.11 |
| 598 | 34 | 35.5 | 31 | 35.3 | 31.7 |
| 730 | 36.37 | 33.76 | 35.16 | 33.16 | 35.87 |
| 796 | 35.37 | 39.07 | 31.77 | 34.27 | 31.08 |

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
   a plate coupled to a die of an integrated circuit for thermal dissipation, the plate having first and second pluralities of grooves comprising non-periodic lines in first and second directions, respectively, the first and second pluralities of grooves forming a grid pattern.

2. The apparatus of claim 1 wherein the non-periodic lines are substantially parallel in the corresponding direction.

3. The apparatus of claim 2 wherein distances between pairs of the substantially parallel lines are different.

4. The apparatus of claim 3 wherein the grid pattern corresponds to a frequency different than a resonant frequency of the plate caused by eddy currents flowing from the integrated circuit.

5. The apparatus of claim 4 wherein the first and second directions are approximately orthogonal.

6. The apparatus of claim 5 wherein the first direction is substantially parallel to one side of the plate.

7. The apparatus of claim 5 wherein the first direction is slanted with respect to one side of the plate.

8. The apparatus of claim 7 wherein the first and second pluralities of grooves are on one side of the plate.

9. A method comprising:
   edging first and second pluralities of grooves on a plate coupled to a die of an integrated circuit, the first and second pluralities of grooves comprising non-periodic lines in first and second directions, respectively, and forming a grid pattern.

10. The method of claim 8 wherein the non-periodic lines are substantially parallel in the corresponding direction.

11. The method of claim 10 wherein distances between pairs of the substantially parallel lines are different.

12. The method of claim 11 wherein the grid pattern corresponds to a frequency different than a resonant frequency of the plate caused by eddy currents flowing from the integrated circuit.

13. The method of claim 12 wherein the first and second directions are approximately orthogonal.

14. The method of claim 13 wherein the first direction is substantially parallel to one side of the plate.

15. The method of claim 13 wherein the first direction is slanted with respect to one side of the plate.

16. The method of claim 15 wherein the first and second pluralities of grooves are on one side of the plate.

17. An integrated circuit (IC) package assembly comprising:
   a substrate;

a packaging array;

a die of an integrated circuit coupled to the packaging array; and a heat sink element coupled to the die, the heat sink element comprising:

a plate coupled to a substrate of an integrated circuit for thermal dissipation, the plate having first and second pluralities of grooves comprising non-periodic lines in first and second directions, respectively, the first and second pluralities of grooves forming a grid pattern.

18. The assembly of claim 17 wherein the non-periodic lines are substantially parallel in the corresponding direction.

19. The assembly of claim 18 wherein distances between pairs of the substantially parallel lines are different.

20. The assembly of claim 19 wherein the grid pattern corresponds to a frequency different than a resonant frequency of the plate caused by eddy currents flowing from the integrated circuit.

21. The assembly of claim 20 wherein the first and second directions are approximately orthogonal.

22. The assembly of claim 21 wherein the first direction is substantially parallel to one side of the plate.

23. The assembly of claim 21 wherein the first direction is slanted with respect to one side of the plate.

24. The assembly of claim 23 wherein the first and second pluralities of grooves are on one side of the plate.

25. The assembly of claim 23 wherein the packaging array is an organic land grid array(OLGA).

* * * * *